(12) United States Patent
Iwasaki et al.

(10) Patent No.: US 7,190,558 B2
(45) Date of Patent: Mar. 13, 2007

(54) MAGNETORESISTIVE EFFECT ELEMENT, MAGNETIC HEAD AND MAGNETIC REPRODUCING APPARATUS

(75) Inventors: Hitoshi Iwasaki, Kanagawa-ken (JP); Katsuhiko Koui, Kanagawa-ken (JP); Masatoshi Yoshikawa, Kanagawa-ken (JP); Hiromi Yuasa, Kanagawa-ken (JP); Hideaki Fukuzawa, Kanagawa-ken (JP); Masashi Sahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 10/178,023

(22) Filed: Jun. 24, 2002

(65) Prior Publication Data

US 2003/0011463 A1    Jan. 16, 2003

(30) Foreign Application Priority Data

Jun. 22, 2001    (JP)    ............................. 2001-190512

(51) Int. Cl.
*G11B 5/33*    (2006.01)
(52) U.S. Cl. ................................. 360/324.11
(58) Field of Classification Search ........... 360/324.11, 360/324.12, 329.2, 324.2, 314; 428/692
See application file for complete search history.

(56) References Cited

U.S. PATENT DOCUMENTS

| | | | |
|---|---|---|---|
| 5,949,622 A * | 9/1999 | Kamiguchi et al. .... | 360/324.12 |
| 6,249,407 B1 * | 6/2001 | Aoshima et al. ......... | 360/324.2 |
| 6,348,274 B1 | 2/2002 | Kamiguchi et al. | |
| 6,407,890 B1 * | 6/2002 | Gill ............................. | 360/314 |
| 6,473,279 B2 * | 10/2002 | Smith et al. ........... | 360/324.12 |
| 6,560,078 B1 * | 5/2003 | Pinarbasi ................ | 360/324.11 |
| 6,611,405 B1 * | 8/2003 | Inomata et al. ......... | 360/324.2 |
| 6,661,626 B2 * | 12/2003 | Gill ......................... | 360/324.2 |
| 6,680,831 B2 | 1/2004 | Hiramoto et al. | |
| 6,710,984 B1 * | 3/2004 | Yuasa et al. ............ | 360/324.11 |
| 6,721,149 B1 * | 4/2004 | Shi et al. .................. | 360/324.2 |
| 6,741,434 B1 * | 5/2004 | Sato et al. ............... | 360/324.2 |
| 6,756,135 B2 * | 6/2004 | Hasegawa et al. .......... | 428/692 |
| 6,798,625 B1 * | 9/2004 | Ueno et al. ............ | 360/324.12 |
| 2003/0011463 A1 | 1/2003 | Iwasaki et al. | |

FOREIGN PATENT DOCUMENTS

| | | |
|---|---|---|
| JP | 05-275769 | 10/1993 |
| JP | 10-284765 | 10/1998 |
| JP | 11-289115 | 10/1999 |
| JP | 2000-252548 | 9/2000 |
| JP | 2001-160640 | 6/2001 |
| JP | 2002-190631 | 7/2002 |

* cited by examiner

*Primary Examiner*—Tianjie Chen
(74) *Attorney, Agent, or Firm*—Oblon, Spivak, McClelland, Maier & Neustadt, P.C.

(57) ABSTRACT

In a CPP element using a metal intermediate layer excellent in shot noise and response to high frequencies unlike a TMR element, its magnetoresistive effect film includes a magnetic layer mainly made of a half-metal exhibiting ferromagnetism, ferrimagnetism or antiferromagnetism, and largely variable in way of conduction in response to spin direction of electrons.

11 Claims, 8 Drawing Sheets

MAGNETORESISTIVE EFFECT ELEMENT, MAGNETIC HEAD AND MAGNETIC REPRODUCING APPARATUS

CROSS-REFERENCE TO RELATED APPLICATIONS

This application is based upon and claims the benefit of priority from the prior Japanese Patent Application No. 2001-190512, filed on Jun. 22, 2001; the entire contents of which are incorporated herein by reference.

BACKGROUND OF THE INVENTION

This invention relates to a magnetoresistive effect element, magnetic head and magnetic recording apparatus, and more particularly, to a magnetoresistive effect element structured to flow a sense current vertically of the film surface of a magnetoresistive effect film, as well as a magnetic head and a magnetic reproducing apparatus using the magnetoresistive effect element.

Following to the discovery of giant magnetoresistive effects (GMR) in multi-layered structures of magnetic layers, there is an epoch-making progress in performance of magnetic devices, especially of magnetic heads. Especially, discovery of GMR by spin-valve (SV) films brought about a large technical progress in the field of magnetic devices.

A spin-valve film is a multi-layered film made by interposing a nonmagnetic layer between two metal ferromagnetic films, in which magnetization of only one ferromagnetic layer (called "pinned layer" or "magnetization-pinned layer") is fixed in one direction by a bias magnetic field from an antiferromagnetic layer or hard-magnetic layer whereas magnetization of the other ferromagnetic layer (called "free layer" or "magnetization free layer") varies in direction in response to an external magnetic head to make a relative angle with respect to the pinned layer, thereby to exhibit a giant magnetoresistance change.

Regarding this kind of spin valve films, those used in CPP (current perpendicular to plane) type magnetoresistive effect elements configured to supply a sense current substantially perpendicularly to the film plane exercise larger giant magneto resistive effects than those used in CIP (current in plane) type magnetoresistive effect elements configured to supply a sense current in parallel to the film plane.

As one type of CPP type magnetoresistive effect elements, TMR elements making use of tunneling magnetoresistive effect (TMR) have also been developed. TMR elements, however, are characterized in the use of an insulating layer of alumina, for example, as the intervening nonmagnetic layer, and accordingly, there is a difference also in the mechanism of the device operation.

In addition to giving a larger magnetoresistive variable rate that that of a CIP magnetoresistive effect element, a CPP magnetoresistive effect element additionally has the advantage that the resistance variable amount increases when the device is downsized because the resistance of the element depends on the device area. This advantage is more significant today where magnetic devices are progressively downsized. Therefore, magnetic CPP magnetoresistive effect elements and magnetic heads using them will be hopeful candidates for realization of a recording density not lower than 100 gigabits per square inch (100 Gbpsi).

However, in case of TMR elements, the insulator used as the intermediate layer excessively increase the device resistance, and it is its difficulty that downsizing of the device area causes shot noise peculiar to the tunneling phenomenon due to a large resistance, or deterioration of the response to high frequencies.

On the other hand, in case of CPP elements using a metal nonmagnetic intermediate layer and having a much smaller device resistance than TMR elements, when a sense current is supplied perpendicularly to the film plane, the resistance variable amount itself is significantly small even though the resistance variable rate is gigantic. As a result, it is difficult to obtain a large reproduction output signal.

For the purpose of overcoming this problem, there is a report on a method of increasing the resistance and obtaining a large change of resistance by stacking an extremely thin oxide layer on a CPP element using a metal nonmagnetic intermediate layer (K. Nagasaka et al; The 8th Joint MMM-Intermag. Conference, DD-10). In this method, it is attempted to obtain a high resistance by locally forming a metal-like low-resistance region like a pinhole in an oxide layer and confining a current thereby. However, it is difficult to form uniform pinholes. Thus, it is a hurdle against its practical use that the resistance largely varies when the recording density increases to or beyond 100 Gbpsi, where the device size is in the order of 0.1 µm, and uniform CPP elements are difficult to manufacture.

BRIEF SUMMARY OF THE INVENTION

According to an embodiment of the invention, there is provided a magnetoresistive effect element comprising: a magnetoresistive effect film including a magnetization-pinned layer having a magnetic film pinned in magnetization substantially in one direction, a magnetization free layer having a magnetic film variable in direction of magnetization in response to an external magnetic field, and a nonmagnetic metal intermediate layer interposed between said magnetization-pinned layer and said magnetization free layer; and a pair of electrodes electrically coupled to said magnetoresistive effect film to supply a current substantially perpendicularly to the film plane of said magnetoresistive effect film, at least one of said magnetization-pinned layer, said magnetization free layer and said nonmagnetic metal intermediate layer including a first layer which contains a half-metal as a major component thereof and a second layer whose content of said half-metal is lower than said first layer.

According to another embodiment of the invention, there is provided a magnetoresistive effect element comprising: a magnetoresistive effect film including a magnetization-pinned layer having a magnetic film pinned in magnetization substantially in one direction, a magnetization free layer having a magnetic film variable in direction of magnetization in response to an external magnetic field, and a nonmagnetic metal intermediate layer interposed between said magnetization-pinned layer and said magnetization free layer; and a pair of electrodes electrically coupled to said magnetoresistive effect film to supply a current substantially perpendicularly to the film plane of said magnetoresistive effect film, a first layer which contains a half-metal as a major component thereof being interposed in at least one of a location between said magnetization-pinned layer and said nonmagnetic metal intermediate layer and a location between said magnetization free layer and said nonmagnetic metal intermediate layer.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Some embodiments of the invention will now be explained below with reference to the drawings.

Figure 1A:
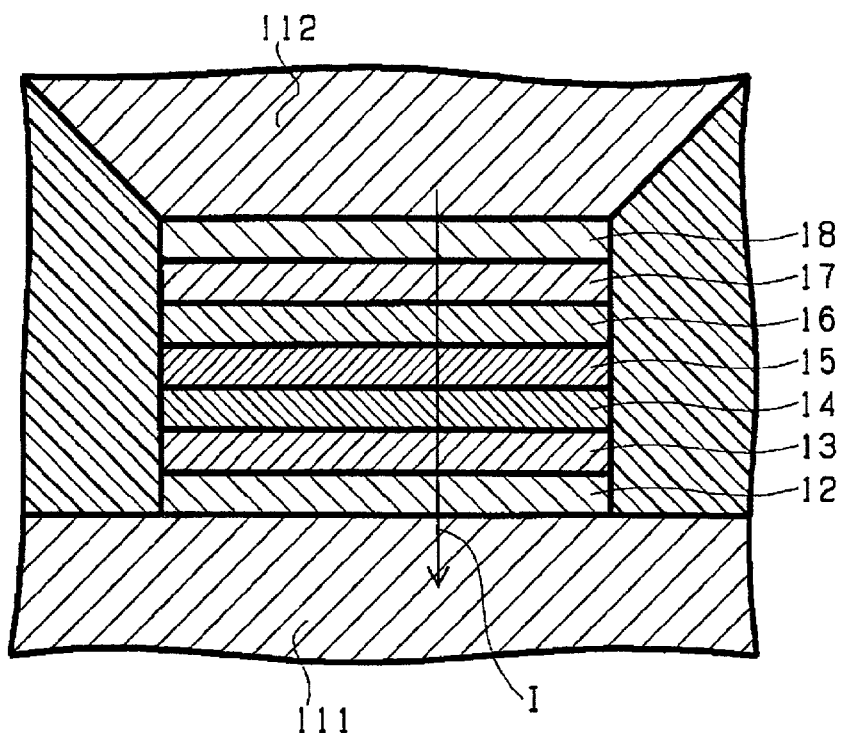
FIG. 1A is a schematic diagram that shows a cross-sectional structure of the substantial part of a magnetoresistive effect element according to the first embodiment of the invention.

FIG. 1A is a schematic diagram that shows a cross-sectional structure of the substantial part of a magnetoresistive effect element according to the first embodiment of the invention. FIG. 1A is a cross-sectional view taken along a plane parallel to the medium-facing surface of the magnetoresistive effect element assumed to be used in a magnetic head.

As illustrated here, the magnetoresistive effect element according to the embodiment of the invention includes a magnetoresistive effect film made by sequentially depositing on a lower electrode 111 a base layer 12, free layer 13 variable in magnetization in response to an external signal magnetic field, nonmagnetic intermediate layer 14, pinned layer 15 substantially fixed in magnetization against an external signal magnetic field, magnetic coupling intermediate layer 16, antiferromagnetic layer 17, and protective film 18. The protective film 18 is not indispensable if the antiferromagnetic layer 17 does not deteriorate in property upon deposition of an upper electrode.

The upper electrode 112 is formed on the magnetoresistive effect film, and a sense current I is supplied perpendicularly to the film plane of the multi-layered structure through the electrodes 111 and 112.

In this embodiment, the pinned layer 15 is made of a half-metal.

Throughout this specification, the "half-metal" pertains to a material exhibiting ferromagnetism, ferrimagnetism or antiferromagnetism, and largely varies in aspect of electric conduction with spin direction of electrons.

More specifically, a half-metal is a material that significantly lowers the resistance of electrons having spins in the same direction as the magnetization (spins) of the half-metal (called up-spin electrons) as compared with the resistance of electrons having spins in the opposite (called down-spin electrons), or contains a much larger number of up-spin electrons than down-spin electrons.

In other words, in this specification, the "half-metal" is a material that permits only electrons having spins in a certain direction to pass through and prohibits other electrons having spins in the opposite direction to pass through.

Materials usable as the half-metal are, for example, iron oxides like $Fe_3O_4$, chromium oxides like $CrO_2$, and manganese oxides having a perovskite-structured crystal structure (so-called manganites such as LrSrMnO). Furthermore, various kinds of nitrides and carbides such as Fe nitrides, Mn nitrides like GaMnN, and Fe carbides, for example, are also usable to form the half-metal layer.

In this invention, a large magnetoresistance effect can be realized by forming an interface between the half-metal layer and the magnetic layer made of the magnetic material such as Co, Fe or Ni. By utilizing such an interface effect, the half-metal layer in this invention need not be a epitaxially grown single crystalline layer without any impruties. Instead, in the present invention, a large difference in resistance or difference in number between the up-spin electrons and the down-spin electrons is realized without such a perfect crystalinity of the half-metal layer. This is because of the interface effect obtained by forming the interface between the half-metal layer. From this point of view, the structure having a thin half-metal layer and a magnetic layer in the direct contact therewith is one important feature of the invention.

The Inventors have found the new phenomenon that a CPP SV film making use of that nature of the half-metal can be largely increased in resistance variable amount because the half-metal permits substantially only up-spin electrons to pass through and be injected in a second magnetic layer through a nonmagnetic intermediate layer. This phenomenon does not appear in conventional CIP magnetoresistive effect elements configured to supply a current in parallel to the film plane. As compared with TMR elements using an insulator in the nonmagnetic intermediate layer, an effect of reflecting electrons at the interface between the half-metal and a metal layer, which is impossible with a tunneling current, can be expected as well, and a large change of resistance can be realized.

In the embodiment of the invention, up-spin electrons taking major part of conduction flow in the half-metal layer in a metallic manner and not as a tunneling current. Therefore, when the temperature dependency of the resistance is measured, TMR exhibits an increase of resistance as the temperature lowers, but the embodiment of the invention exhibits a decrease of resistance as the temperature lowers. This is a large difference of the embodiment of the invention from TMR.

In the embodiment of the invention, as explained in greater detail, the half-metal layer may be provided in any of other various locations of the magnetoresistive effect element other than the location shown in FIG. 1A.

For example, the pinned layer may be made of a half-metal either partly or entirely. In this case, if magnetization of the free layer is oriented in the same direction as up-spin electrons injected from the half-metal, the up-spin electrons are not scattered in the free layer, and the element exhibits a low resistance.

On the other hand, when the magnetization of the free layer rotates in the opposite direction from up-spin electrons, up-spin electrons are scattered when passing the free layer, and the element exhibits a high resistance. As compared with ordinary magnetic films in which down-spin electrons also contribute to conduction, conduction by up-spin electrons, exclusively, can be used here, and a large resistance variable rate having been impossible to obtain with conventional CPP SV can be obtained.

If a $Fe_3O_4$ oxide is taken as an example, various kinds of process can be employed for making the half-metal, such as sputtering using a target containing $Fe_3O_4$ as its major component, or reactive sputtering of Fe or Fe-group alloy in an oxygen atmosphere. Also employable is a method of first depositing Fe or a Fe-group alloy of Fe and additional Co, for example, and thereafter oxidizing it by irradiation of atomic oxygen, radical oxygen or oxygen ions.

Thickness of the pinned layer 15 made of such a half-metal is preferably in the range from 0.5 to 5 nm, and is preferably formed as a continuous oxide film as far as possible. If the layer includes metallic pinhole regions in excess of 15%, the conduction phenomenon of electrons passing through the pinholes becomes dominant, and the effect of increasing the change of resistance by the embodiment of the invention will be lost.

Similarly to ordinary spin valve GMR, magnetization of the pinned layer 15 is fixed in one direction by the overlying antiferromagnetic layer 17 (made of, for example, PtMn, IrM, PdPtMn, NiMn, or the like).

That is, to fix the magnetization of the pinned layer, it is desirable to deposit the pinned layer on an antiferromagnetic film (of PtMn, IrMn, or the like) and use an exchanging coupling bias magnetic field generated along their interface. If an oxide as the half metal and a metal antiferromagnetic film are stacked in direct contact, the exchanging coupling magnetic field is usually weakened. Therefore, a metal ferromagnetic film of Co, Fe Ni, for example, is desirably inserted along the interface.

That is, to enhance the magnetization fixing effect of the pinned layer 15, the magnetic coupling intermediate layer 16 is preferably inserted between the antiferromagnetic layer 17 and the pinned layer 15. Material of the magnetic coupling intermediate layer 16 may be, for example, a ferromagnetic alloy containing Fe, Co, Ni, or the like, as its major component. Its thickness must be thinned as far as possible, namely as thin as approximately 0.1 to 3 nm, to prevent magnetization of the pinned layer 15.

A multi-layered ferri-type structure of ferromagnetic layer/Ru (ruthenium) layer/ferromagnetic layer employed in spin valve GMR is also an advantageous material of the magnetic coupling intermediate layer 16 to prevent magnetization of the pinned layer 15. In this multi-layered structure, upper and lower ferromagnetic layers are brought into antiferromagnetic coupling via the Ru layer. One of the ferromagnetic layers in contact with the pinned layer 15 may be omitted if the antiferromagnetic coupling of the Ru layer is sufficient.

If a magnetic layer whose up-spin electrons are more unlikely to be scattered at the interface with the half-metal 15 than at the interface with the nonmagnetic metal intermediate layer 144 is inserted between the pinned layer 15 and the nonmagnetic metal intermediate layer 14, then the resistance variable amount increases more remarkably. For example, in case the $Fe_3O_4$ half-metal is used as the material of the pinned layer 15, the magnetic layer containing Fe is preferably inserted between the pinned layer 15 and the intermediate layer 14.

Materials usable for forming the free layer 13 are, for example, CoFe, NiFe and CoFeNi alloys. Multi-layered structures of these alloy layers are also acceptable. Examples of the multi-layered structure are NiFe/CoFe, CoFe/NiFe, NiFe/CoFe/NiFe, CoFe/NiFe/CoFe, or the like.

A multi-layered structure of any of those alloys and a nonmagnetic layer may be used as the free layer 13. Examples of the multi-layered structure are CoFe/Cu/CoFe, NiFe/CoFe/Cu/CoFe/NiFe. In case of Co-system alloys exhibiting large interface scattering with respect to nonmagnetic layers, larger effects of lamination with a nonmagnetic layer can be expected than those of Ni-system alloys.

Total thickness of the free layer 13 is desirably in the range of 0.5 to 7 nm.

The base layer 12 is preferably made of a material having the function of improving crystal properties of the overlying free layer 13 and pinned layer 15, the function of enhancing smoothness of the interface, and so on. NiFeCr alloys are examples of this kind of material. Although not shown, a low-resistance nonmagnetic layer (such as Cu layer) may be interposed between the base layer 12 and the free layer 13.

It is necessary for the nonmagnetic intermediate layer 14 to have the role of interrupting magnetic coupling between the pinned layer 15 and the free layer 13, and the role of forming the interface between the nonmagnetic intermediate layer 14 and the pinned layer, which do not scatter up-spin electrons flowing from the pinned layer 15 to the free layer 13. Adequate materials of the nonmagnetic intermediate layer 14 are, for example, Cu, Au, Ag, Re, Os, Ru, Ir, Pd, Cr, Mg, Al, Rh, Pt, and so on. The nonmagnetic intermediate layer 14 must be thick enough to sufficiently interrupt magnetic coupling between the free layer 13 and the pinned layer 15 and thin enough to prevent scattering of up-spin electrons from the pinned layer 15. Thickness in the range of approximately 0.5 to 5 nm is preferable although it depends on the material.

With the magnetoresistive effect element made up of the above-explained components, a voltage is applied across the upper and lower electrodes 111, 112 to mainly inject up-spin electrons through the pinned layer 15 of a half-metal into the free layer 13. As a result, if the magnetization of the free layer 13 is in the same direction as that of the pinned layer 15, the up-spin electrons are not scattered, and the resistance is low. In contrast, when the magnetization of the free layer 13 is oriented in the anti-parallel direction, the resistance increases due to magnetic scattering.

Therefore, as compared with ordinary metal-type CPP-GMR, much larger increase of the resistance variable rate can be realized. Additionally, as compared with ordinary metal-type CPP-GMR, resistance can be increased because of a less number of electrons taking part of conduction. That is, it is possible to realize a large change of resistance and to realize a magnetic head ensuring a large reproduction output.

On the other hand, unlike TMR elements, the magnetoresistance effect element according to the embodiment of the invention does not produce shot noise that is a peculiar phenomenon of tunneling. Therefore, reproduction under a high S/N ratio is enabled in addition to obtaining a large reproduction output.

To obtain a large change of resistance in the embodiment of the invention, it is desirable that up-spin electrons are not scattered and only down-spin electrons are scattered in accordance with the magnetization direction of the free layer 13, and for this purpose, good crystal property minimized in crystal defects (for example, good crystal orientation) must be realized around the free layer 13. The so-called top-type shown in FIG. 1A makes it possible to form thin films around the free layer 13 prior to deposition of the oxide pinned layer 15, and it is advantageous in facilitating the control of crystal growth around the free layer 13.

Furthermore, the following effect is also expected by employment of the embodiment of the invention. That is, to sufficiently increase spin-relied scattering in an ordinary metal-type CPP-GMR, the pinned layer and the free layer inevitably become thick. However, the embodiment of the invention, which uses half-metals excellent in spin polarization, can reduce their physical thickness to be suitable for a narrow gap. Additionally, since saturation magnetization of half-metals is small, the pinned layer 15 can be thinned. As a result, magnetization can be fixed sufficiently, and the embodiment can satisfy the demand on reliable pinning of magnetization that will be required in accordance with enhancement of recording density, i.e. downsizing of devices.

Figure 1B:
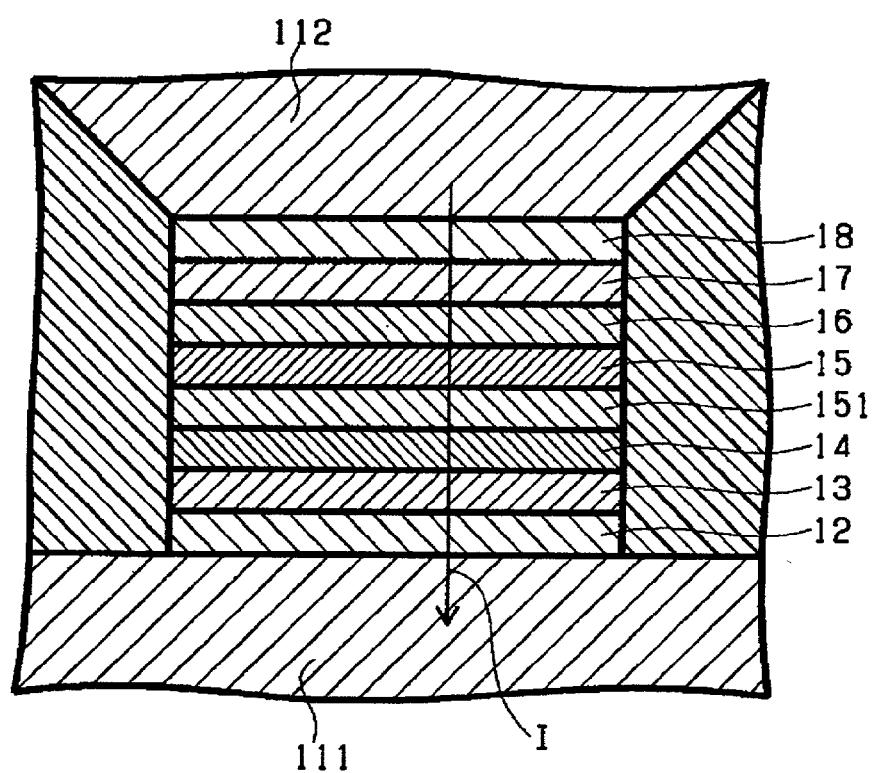
FIG. 1B shows a modification of the first embodiment shown in FIG. 1A.

FIG. 1B shows a modification of the first embodiment shown in FIG. 1A. FIG. 1B is also a cross-sectional view taken along a plane parallel to the medium-facing surface of the magnetoresistive effect element assumed to be used in a magnetic head. In this modification, another pinned layer 151 is inserted between the pinned layer 15 of a half-metal and the nonmagnetic intermediate layer 14 in the embodiment shown in FIG. 1A.

The pinned layer 151 is a metal magnetic layer made of Co, Fe, Ni, or ay of their alloys, and its thickness is preferably limited in the range of 0.1 to 4 nm. Insertion of the pinned layer 15 makes it possible to slow the deterioration of the resistance variable rate by the interface between the nonmagnetic intermediate layer 14 and the half-metal pinned layer 15. Therefore, this modification is advantageous for obtaining a large resistance variable rate.

Next explained are magnetoresistive effect elements according to other embodiments of the invention.

Figure 2:
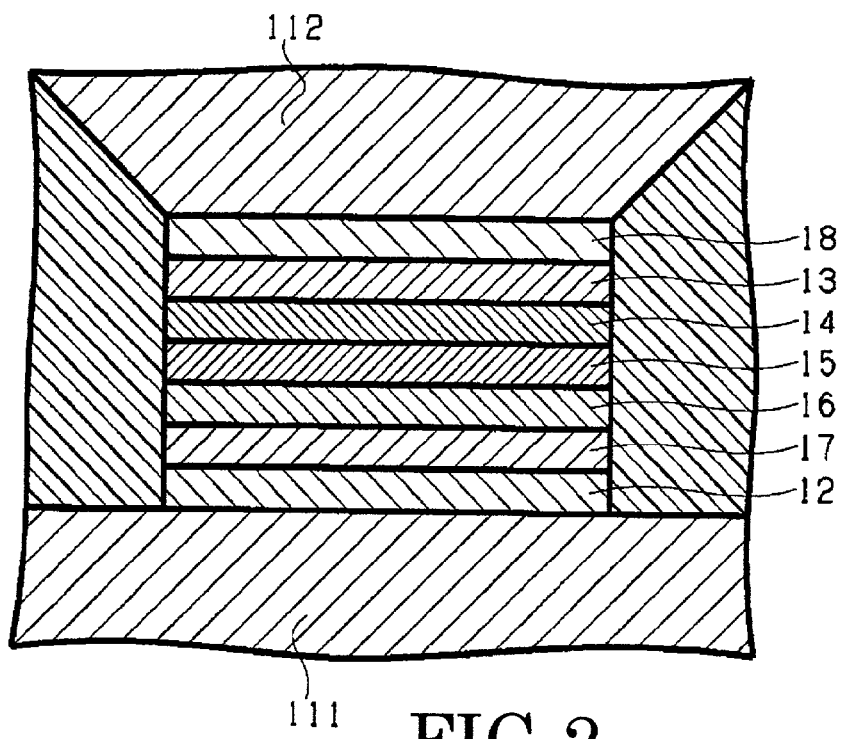
FIG. 2 is a schematic diagram that shows a cross-sectional structure of the substantial part of a magnetoresistive effect element according to the second embodiment of the invention.

FIG. 2 is a schematic diagram that shows a cross-sectional structure of the substantial part of a magnetoresistive effect element according to the second embodiment of the invention. This is also a cross-sectional view taken along a plane parallel to the medium-facing surface of the magnetoresistive effect element assumed to be used in a magnetic head. Some of components shown here, which are common to those of FIG. 1A, are labeled with common reference numerals, and their detailed explanation is omitted here.

The magnetoresistive effect element 10B according to this embodiment is opposite from the element of FIG. 1A in the stacking order of respective layers or films. More specifically, sequentially formed on the lower electrode 111 are the base layer 12, antiferromagnetic layer 17, magnetic coupling intermediate layer 16, pinned layer 15, nonmagnetic intermediate layer 14, free layer 13, and protective layer 18. Then the upper electrode 112 is formed thereon. Even when the stacking order is reversed, the same effects already mentioned in conjunction with FIG. 1A can be obtained.

In case of this embodiment, since the free layer 13 is located upper, its patterning is easy, and the widths and shapes can be controlled reliably.

Next explained is a magnetoresistive effect element according to the third embodiment of the invention.

Figure 3:
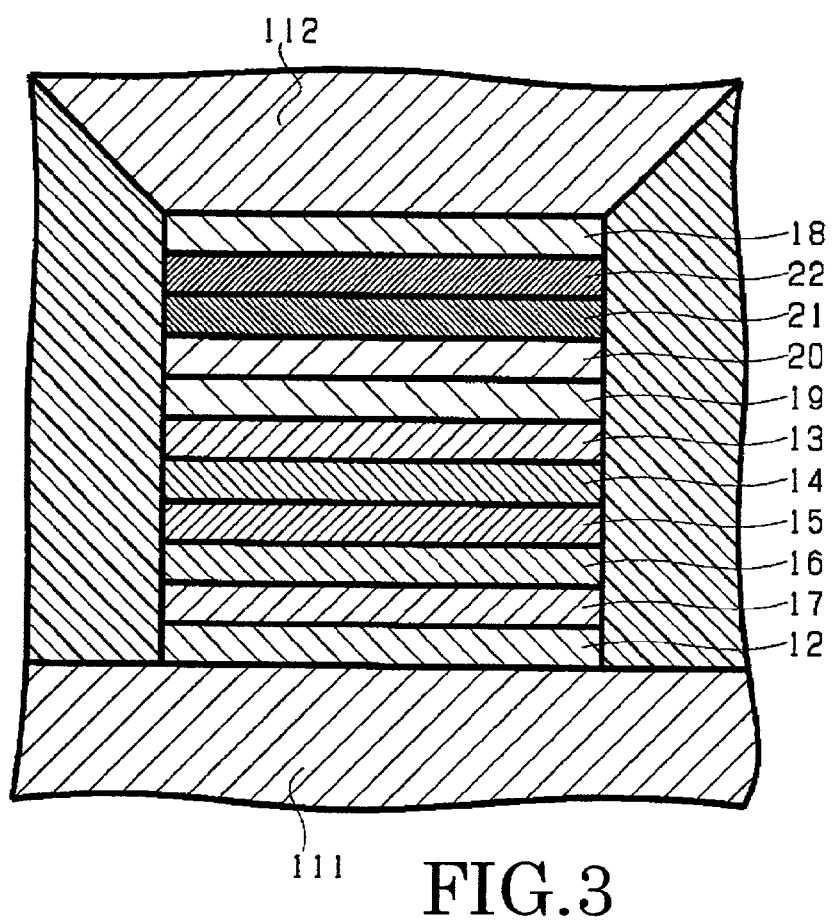
FIG. 3 is a schematic diagram that shows a cross-sectional structure of the substantial part of a magnetoresistive effect element according to the third embodiment of the invention.

FIG. 3 is a schematic diagram that shows a cross-sectional structure of the substantial part of the magnetoresistive effect element according to the third embodiment of the invention. Here again, some of components shown here, which are common to those of FIG. 1A to FIG. 2, are labeled with common reference numerals, and their detailed explanation is omitted here.

The magnetoresistive effect element 10C according to this embodiment has a structure made by additionally stacking, on the free layer 13 of the magnetoresistive effect element 10B of FIG. 2, a second nonmagnetic metal intermediate layer 19, second pinned layer 20 made of a half-metal similar to that of the pinned layer 15, second magnetic coupling intermediate layer 21 similar to the magnetic coupling intermediate layer 16, second antiferromagnetic layer 21 similar to the antiferromagnetic layer 17, and protective film 18 in the described order.

The magnetoresistive effect element 10C according to the instant embodiment, which uses two half-metal pinned layers 15, 20, enhances electron selectivity by their spins, and increases the resistance variable amount more remarkably. As a result, the embodiment ensures more sensitive magnetic detection.

A magnetoresistive effect element according to the fourth embodiment of the invention is next explained below.

Figure 4A:
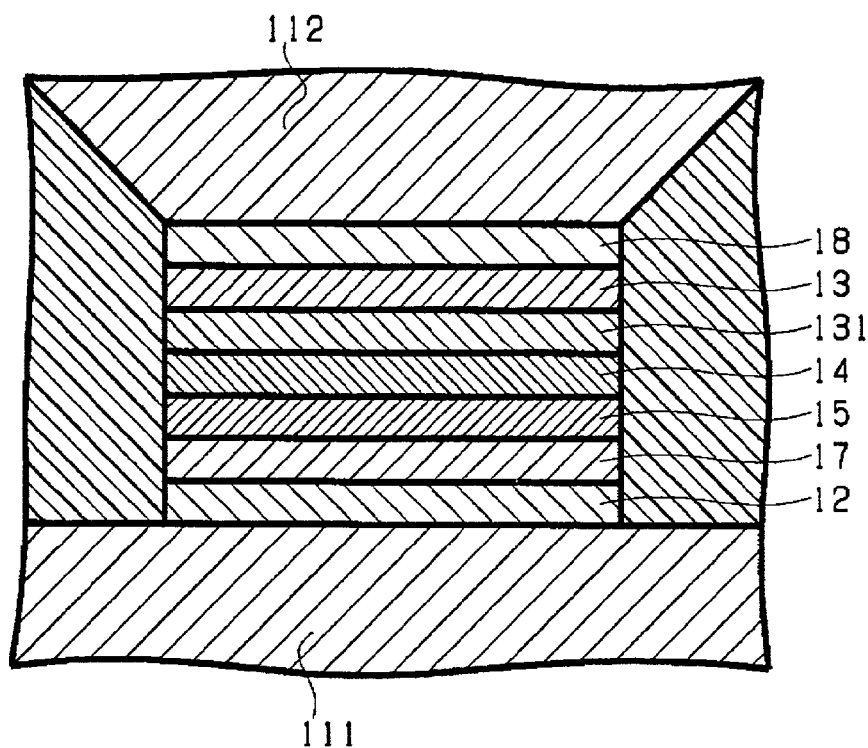
FIG. 4A is a schematic diagram that shows a cross-sectional structure of the substantial part of a magnetoresistive effect element according to the fourth embodiment of the invention.

FIG. 4A is a schematic diagram that shows a cross-sectional structure of the substantial part of the magnetoresistive effect element according to the fourth embodiment of the invention. This is also a cross-sectional view taken along a plane parallel to the medium-facing surface of the magnetoresistive effect element assumed to be used in a magnetic head. Here again, some of components shown here, which are common to those of FIG. 1A through FIG. 3, are labeled with common reference numerals, and their detailed explanation is omitted here.

In the magnetoresistive effect element 10D according to the instant embodiment, a half-metal is used as the free layer 13. That is, a magnetoresistive effect film is formed on the lower electrode 111, which is made by sequentially stacking the base layer 12, antiferromagnetic layer 17, magnetic coupling intermediate layer 16, pinned layer 15, nonmagnetic intermediate layer 14, assist free layer 131, half-metal free layer 13, and protective film 18.

By using a half-metal as the material of the free layer 13, the instant embodiment selectively permits only up-spin electrons to pass through, and can increase the change of magnetoresistance similarly to the foregoing embodiments.

It is possible that the soft-magnetic property (response to magnetic field) of the material used as the half-metal is not sufficiently high. Taking it into consideration, the instant embodiment uses the assist free layer 131 for assisting the magnetization response by an external signal magnetic field, thereby to improve the magnetic field response. As the material of the assist free layer 131, soft-magnetic alloys such as NiFe, CoFeNi and CoFe can be used.

In this embodiment, a half-metal may be used as the pinned layer 15 in addition to the free layer 13.

Figure 4B:
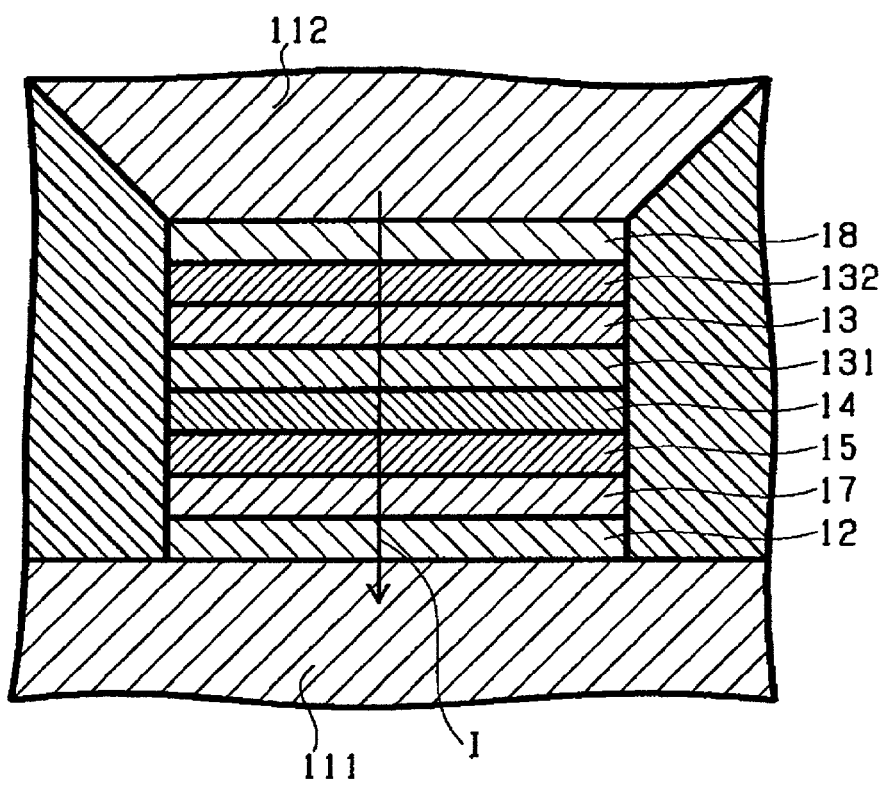
FIG. 4B is a modification of the fourth embodiment shown in FIG. 4A.

FIG. 4B is a modification of the fourth embodiment shown in FIG. 4A. This is also a cross-sectional view taken along a plane parallel to the medium-facing surface of the magnetoresistive effect element assumed to be used in a magnetic head. Here is additionally used a second assist free layer 132 interposed between the free layer 13 and the protective film 18 in the embodiment of FIG. 4A.

The first assist free layer 131 is preferably made of a material exhibiting a high resistance variable rate such as Co or CoFe alloys (preferably, 0.1 nm to 3 nm thick), and the second assist free layer 132 is preferably made of a material exhibiting good soft-magnetism such as NiFe alloy (preferably 0.1 to 8 nm thick). If a NiFe-system alloy is used as the assist free layer 131, satisfactory resistance variable rate is more difficult to obtain than Co or CoFe alloy. The assist free layer 132, however, exerts only small adverse influences to the resistance variable rate, and NiFe alloy more excellent in soft-magnetism than Co or CoFe alloy is preferable as the material of the assist free layer 132.

A magnetoresistive effect element according to the fifth embodiment is next explained below.

Figure 5:
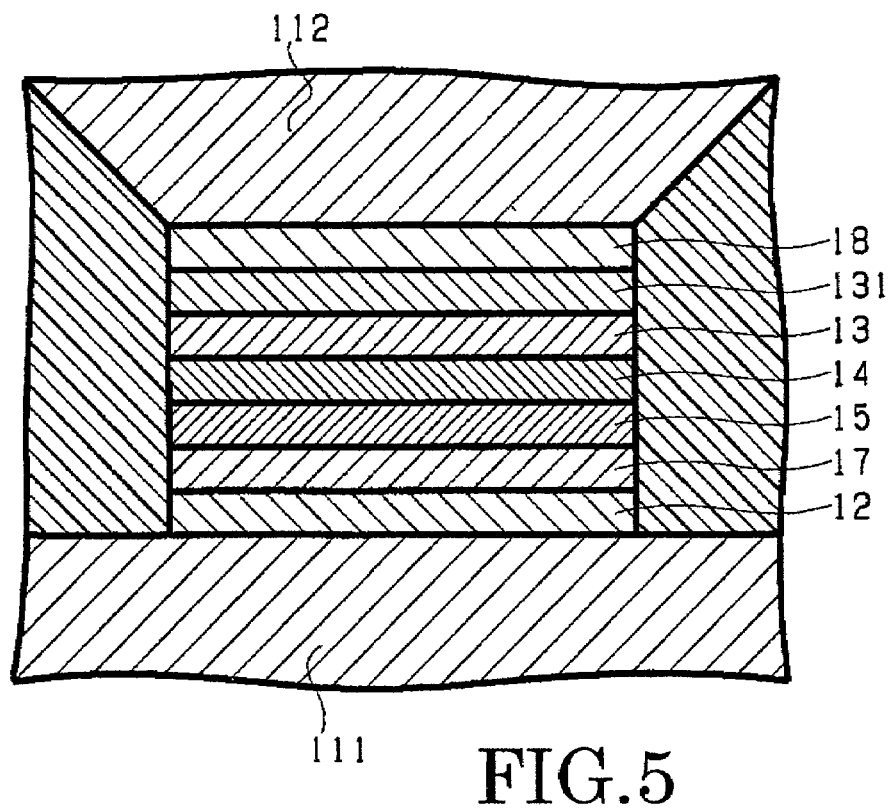
FIG. 5 is a schematic diagram that shows a cross-sectional structure of the substantial part of a magnetoresistive effect element according to the fifth embodiment of the invention.

FIG. 5 is a schematic diagram that shows a cross-sectional structure of the substantial part of the magnetoresistive effect element according to the fifth embodiment of the invention. This is also a cross-sectional view taken along a plane parallel to the medium-facing surface of the magnetoresistive effect element assumed to be used in a magnetic head. Here again, some of components shown here, which are common to those of FIG. 1A through FIG. 4B, are labeled with common reference numerals, and their detailed explanation is omitted here.

Also in the magnetoresistive effect element shown here, a half-metal is used as the free layer 13. In this embodiment, however, location of the assist free layer 131 is different from that of the element 10D shown in FIGS. 4a and 4B. Instead, it is inserted between the protective film 18 and the half metal free layer 13. This positioning of the assist free layer 13 also ensures the same effects.

Also in this embodiment, a half-metal may be used as the pinned layer 15 in addition to the free layer 13.

A magnetoresistive effect element according to the sixth embodiment is next explained below.

Figure 6:
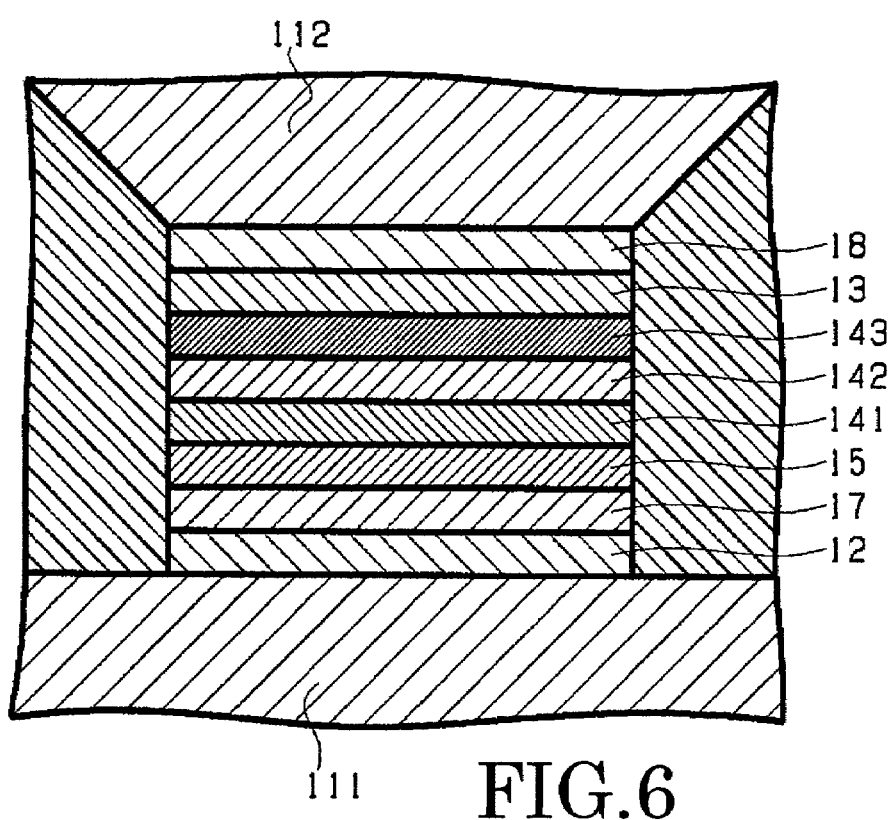
FIG. 6 is a schematic diagram that shows a cross-sectional structure of the substantial part of a magnetoresistive effect element according to the sixth embodiment of the invention.

FIG. 6 is a schematic diagram that shows a cross-sectional structure of the substantial part of the magnetoresistive effect element according to the sixth embodiment of the invention. This is also a cross-sectional view taken along a plane parallel to the medium-facing surface of the magnetoresistive effect element assumed to be used in a magnetic head. Here again, some of components shown here, which are common to those of FIG. 1A through FIG. 5, are labeled with common reference numerals, and their detailed explanation is omitted here.

In the magnetoresistive effect element shown here, a half-metal is inserted in a metal intermediate layer. More specifically, the magnetoresistive effect element 10F has a magnetoresistive effect film on the lower electrode 111, which is made by sequentially stacking the base layer 12, antiferromagnetic layer 17, pinned layer 15, first nonmagnetic metal intermediate layer 141, half-metal layer 142, second nonmagnetic metal intermediate layer 143, free layer 13, and protective film 18. The upper electrode 112 is formed thereon.

The use of a layer of a half-metal inserted in the nonmagnetic metal intermediate layer can also selectively permit only up-spin electrons to pass through, and ensures substantially the same degree of increase of the change of resistance as the above-explained configurations.

In lieu of the configuration shown here, a layer 300 of a half-metal may be provided between the free layer 13 and the intermediate layer 14. Alternatively, as shown in FIG. 8, a layer 300 of a half-metal may be provided between the intermediate layer 14 and the pinned layer 15.

Figure 7:
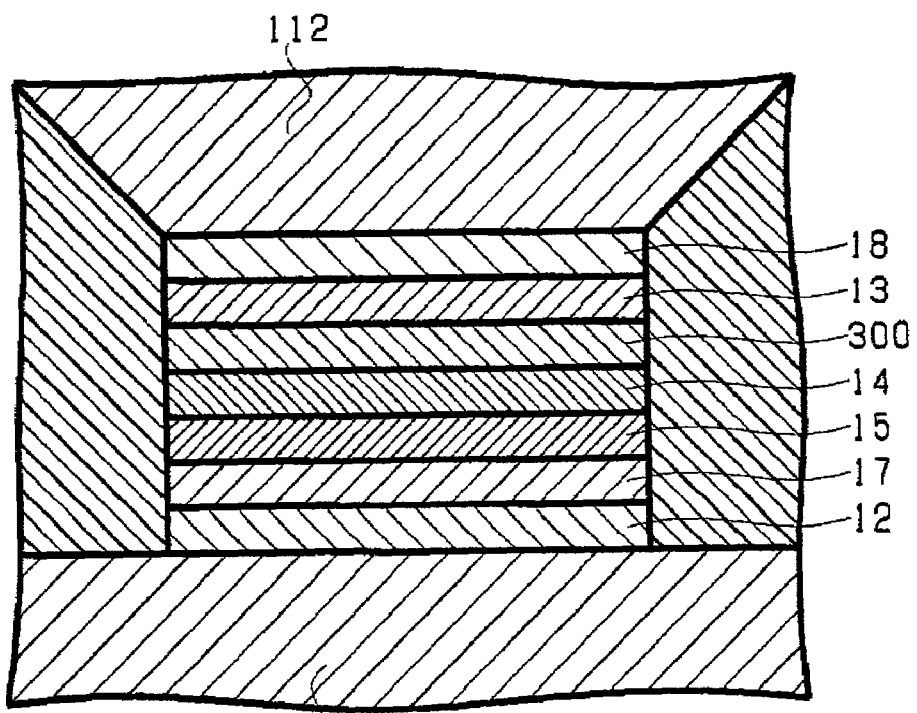
FIG. 7 is a schematic diagram that shows a cross-sectional structure of the substantial part of a magnetoresistive effect element according to the seventh embodiment of the invention.
Figure 8:
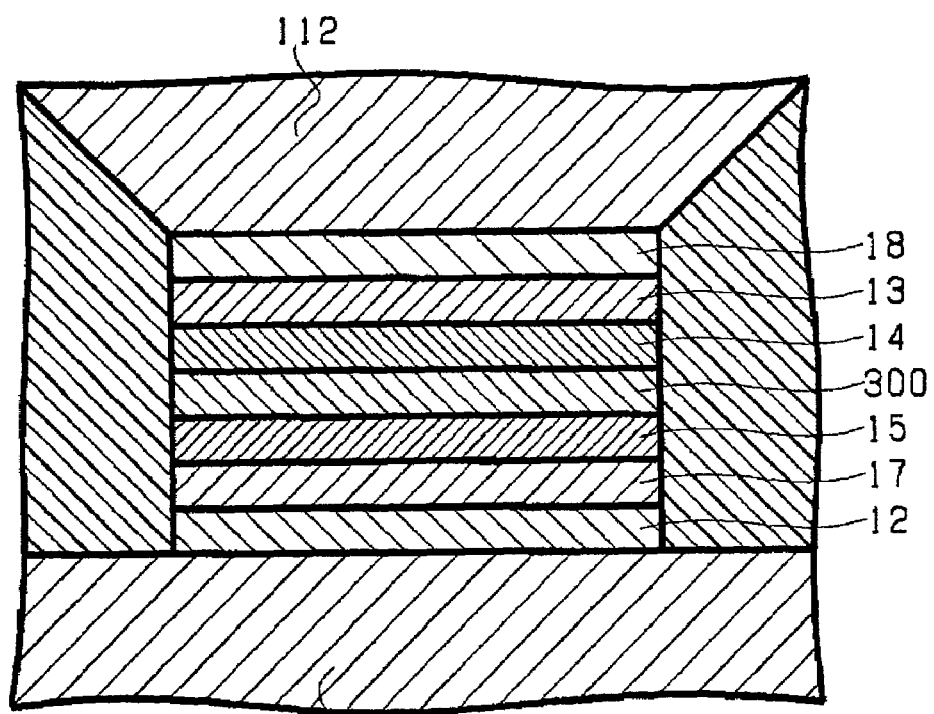
FIG. 8 is a schematic diagram that shows a cross-sectional structure of the substantial part of a magnetoresistive effect element according to the eighth embodiment of the invention.

Furthermore, configurations shown in FIGS. 6 to 8 may be combined. That is, layers of half-metals may be inserted in appropriate locations between adjacent layers of the spin-valve-structured magnetoresistive effect film.

Moreover, in these embodiments, half-metals may be used as the free layer 13 and/or pinned layer 15.

A magnetoresistive effect element according to the ninth embodiment is next explained below.

Figure 9:
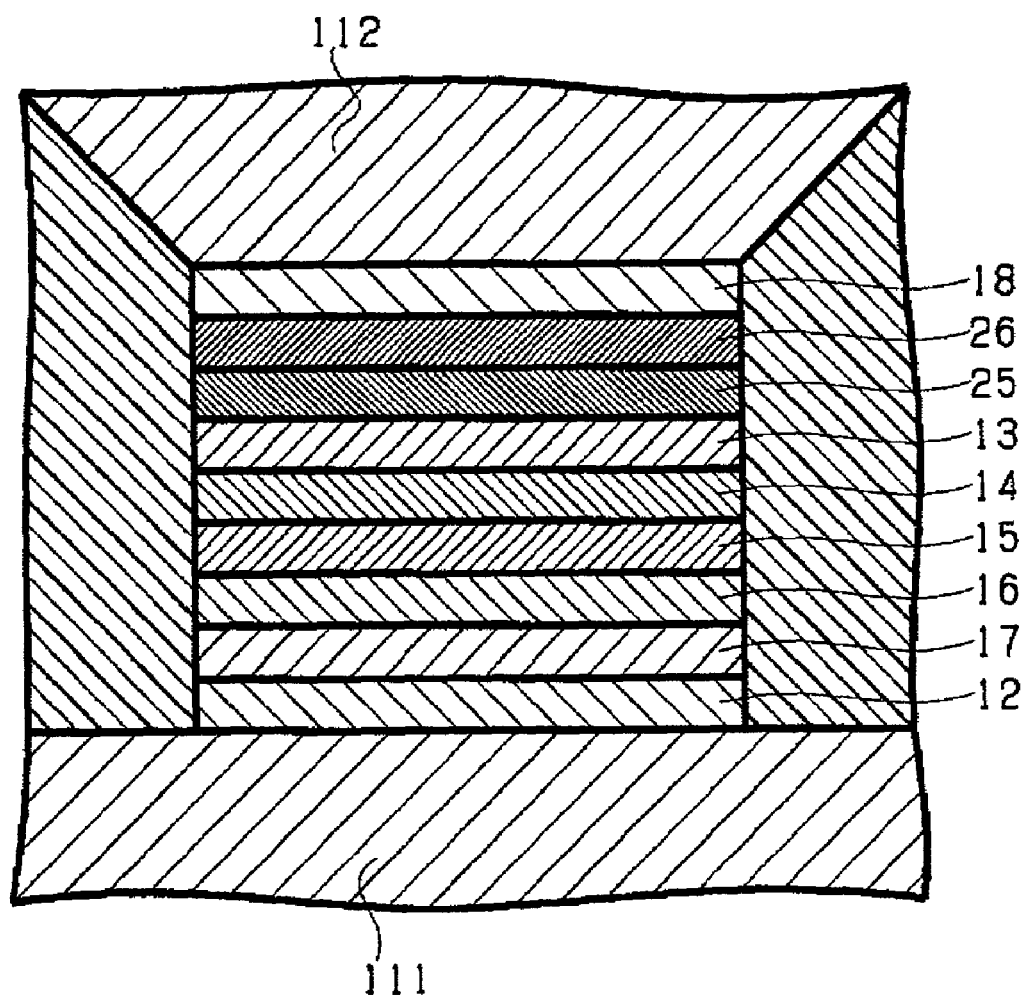
FIG. 9 is a schematic diagram that shows a cross-sectional structure of the substantial part of a magnetoresistive effect element according to the ninth embodiment of the invention.

FIG. 9 is a schematic diagram that shows a cross-sectional structure of the substantial part of the magnetoresistive effect element according to the ninth embodiment of the invention. This is also a cross-sectional view taken along a plane parallel to the medium-facing surface of the magnetoresistive effect element assumed to be used in a magnetic head. Here again, some of components shown here, which are common to those of FIG. 1A through FIG. 6, are labeled with common reference numerals, and their detailed explanation is omitted here.

In this embodiment, both a half-metal and a high-resistance layer not having metallic properties are used.

More specifically, the magnetoresistive effect element 10G includes a magnetoresistive effect film formed on the lower electrode 111 by sequentially stacking the base layer 12, antiferromagnetic layer 17, magnetic coupling intermediate layer 16, pinned layer 15 of a half-metal, nonmagnetic metal intermediate layer 14, free layer 13, intermediate layer 25, free layer 13 variable in magnetization in response to a signal magnetic field, high resistance layer 26, and protective film 18. The upper electrode 112 is formed thereon.

A sense current is supplied through the electrodes 111, 112 perpendicularly to the film plane of this multi-layered structure. In this embodiment, an effect of reflecting electrons at the interface between the half-metal pinned layer 15 and the nonmagnetic metal intermediate layer 14 and at the interface between the intermediate layer 25 and the high resistance layer 26 gives the tendency of confining electrons between the half-metal pinned layer 15 and the high resistance layer 26, and thereby brings about a large change of resistance.

The high resistance layer may be made of an oxide, nitride, carbide or fluoride. More specifically, a Ta (tantalum) oxide, Cr (chromium) oxide or alumina is preferably used.

In this embodiment, the high resistance layer 26 may be replaced with a layer having a high effect of reflecting electrons. Materials usable as the high electron-reflecting effect film are, for example, Au (gold) and Ag (silver). More detailed description in this respect will be found in Japanese Patent Application No. 2001-321171 in the name of the Inventors, et al., the entire contents of this reference being incorporated herein by reference.

Next explained is an embodiment of the invention, which is a magnetic recording apparatus having inboard any of the magnetoresistive effect element explained with reference to FIGS. 1 through 9.

Figure 10:
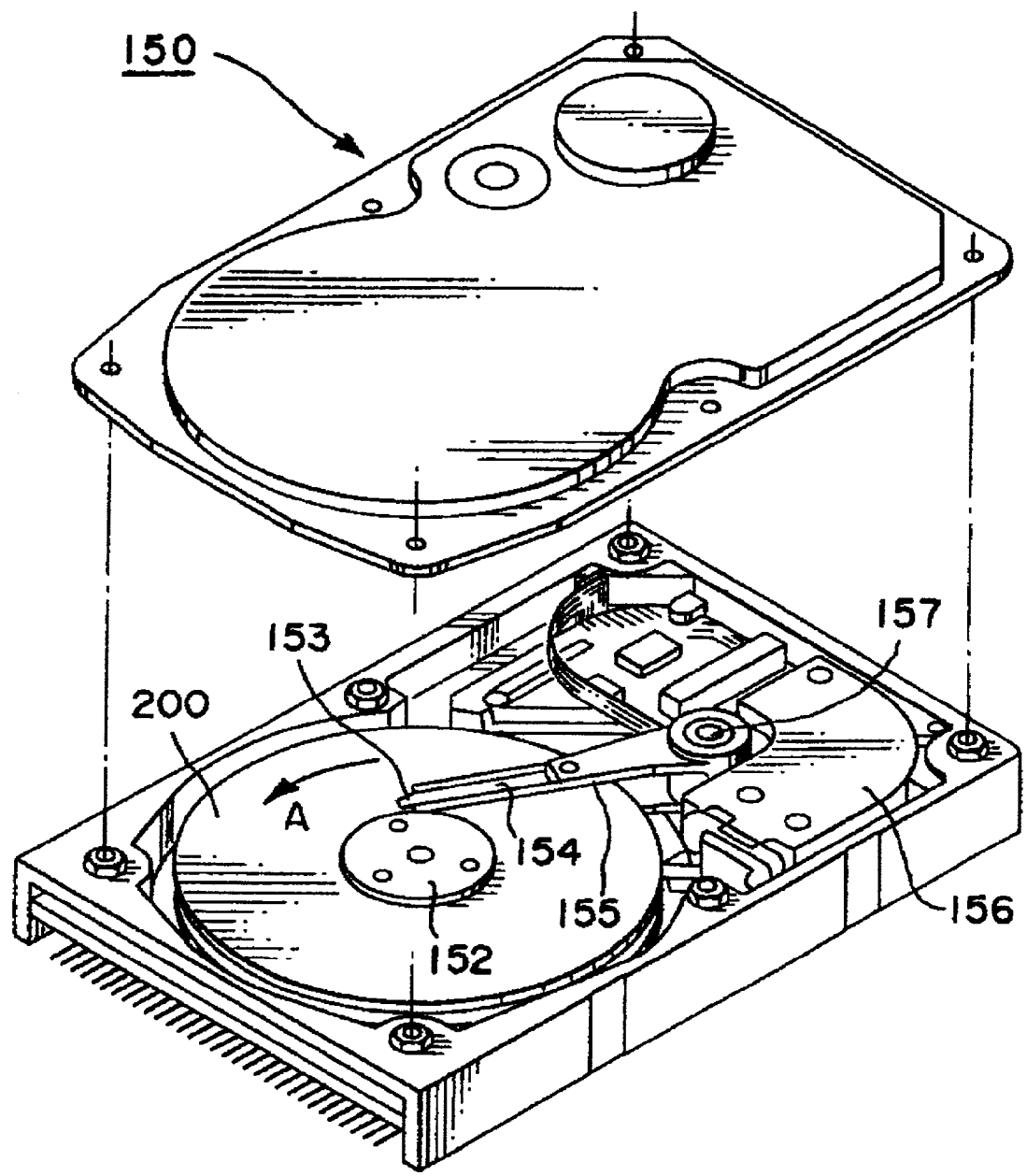
FIG. 10 is a perspective view that roughly illustrates the substantial part of a magnetic recording/reproducing apparatus according to an embodiment of the invention.

FIG. 10 is a perspective view that shows outline configuration of this kind of magnetic recording apparatus. The magnetic recording apparatus 150 shown here is of a type using a rotary actuator. A magnetic recording medium disk 200 is mounted on a spindle 152 and rotated in the arrow A direction by a motor, not shown, which is responsive to a control signal from a controller of a driving mechanism, not shown. The magnetic recording apparatus 150 shown here may have a plurality of medium disks 200 inboard.

The medium disk 200 may be of a "lateral recording type" in which directions of the recording bits are substantially in parallel to the disk surface or may be of a "perpendicular recording type" in which directions of the recording bits are substantially perpendicular to the disk surface.

A head slider 153 for carrying out recording and reproduction of information to be stored in the medium disk 200 is attached to the tip of a film-shaped suspension 154. The head slider 153 supports a magnetoresistive effect element or magnetic head, for example, according to one of the foregoing embodiments of the invention, near the distal end thereof.

Once the medium disk 200 rotates, the medium-facing surface (ABS) of the head slider 153 is held floating by a predetermined distance above the surface of the medium disk 200. Also acceptable is a so-called "contact-traveling type" in which the slider contacts the medium disk 200.

The suspension 154 is connected to one end of an actuator arm 155 having a bobbin portion for holding a drive coil, not shown, and others. At the opposite end of the actuator arm 155, a voice coil motor 156, a kind of linear motor, is provided. The voice coil motor 156 comprises a drive coil, not shown, wound on the bobbin portion of the actuator arm 155, and a magnetic circuit made up of a permanent magnet and an opposed yoke that are opposed to sandwich the drive coil.

The actuator arm 155 is supported by ball bearings, not shown, which are located at upper and lower two positions of the spindle 157 and driven by the voice coil motor 156 for rotating, sliding movements.

Figure 11:
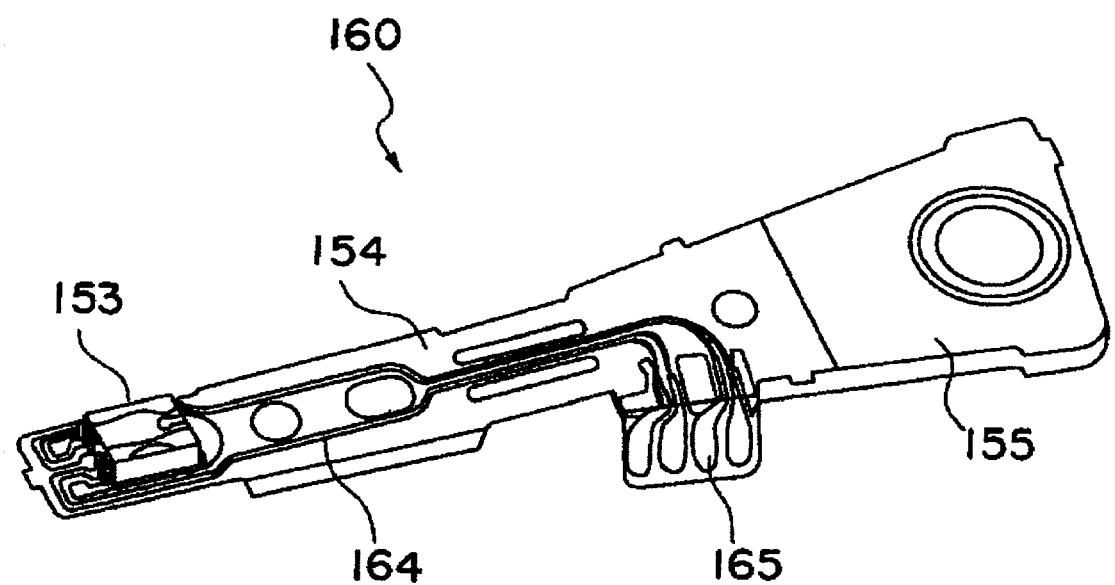
FIG. 11 is an enlarged perspective view of a magnetic head assembly at the distal end of an actuator arm 155, viewed from the disk side.

FIG. 11 is a perspective view of a magnetic head assembly at the distal end from an actuator arm 155 involved, which is viewed from the disk. The magnetic head assembly 160 includes the actuator arm 155 having the bobbin portion supporting the drive coil, for example, and the suspension 154 is connected to one end of the actuator arm 155.

At the distal end of the suspension 154, a head slider 153 carrying the magnetoresistive effect element as explained with reference to FIGS. 1 through 9 is attached. The suspension 154 has a lead 164 for writing and reading signals, and the lead line 164 is connected to electrodes of the magnetic head incorporated in the head slider 153. Numeral 165 in FIG. 11 denotes an electrode pad of the magnetic head assembly 160.

In this embodiment, one of the magnetoresistive effect elements already explained in conjunction with the aforementioned embodiments is used as the magnetoresistive effect element, information magnetically recorded on the medium disk 200 under a higher recording density than before can be read reliably.

Heretofore, some embodiments have been explained by way of specific examples. The invention, however, is not limited to those specific examples.

That is, in those embodiments of the invention, half-metal layers may be used as various layers other than the pinned layer and the free layer as explained above to make up, as already explained, a configuration locally inserting a half-metal layer in the intermediate metal nonmagnetic layer, a configuration inserting a half metal layer outside the multi-layered unit including the free layer, nonmagnetic metal intermediate layer and pinned layer, a configuration inserting a half-metal layer in an intermediate location between the free layer and the nonmagnetic metal intermediate layer, a configuration inserting a half-metal layer an intermediate location between the pinned layer and the nonmagnetic metal intermediate layer, and so forth.

Especially, to obtain a large resistance variable rate, a half-metal layer is preferably inserted outside the multi-layered unit because scattering of up-spin electrons adversely affecting the resistance variable rate is smaller along the interface between the half-metal and a magnetic layer forming the pinned layer or free layer than along the interface between the half-metal and the nonmagnetic intermediate layer. Thickness of the pinned layer or free layer existing between the half-metal and the nonmagnetic intermediate layer is preferably adjusted in the range from 0.1 nm to 5 nm. Here is also usable s structure additionally stacking a magnetic layer operative as a pinned or free layer outside the half-metal, such as the structure of pinned layer/half-metal layer/pinned layer/nonmagnetic intermediate layer/free layer/pinned layer, the structure of pinned layer/nonmagnetic intermediate layer/free layer/half-metal layer/free layer, or the structure of pinned layer/half-metal layer/pinned layer/nonmagnetic intermediate layer/free layer/half-metal layer/free layer, for example.

The half-metal magnetic layer used in some embodiments of the invention is preferably a continuous layer including pinhole regions not exceeding 15% for the purpose of maximizing the effects of the use of a half-metal.

The ratio occupied by pinhole regions is determined by the ratio between pinhole regions (black) and half-metal regions (white in oxides) obtained by transmission electron beam microscopy of a section of the GMR film. If the half-metal layer appears continuous through the cross-sectional TEM, a large resistance variable rate is obtained according to the effects of embodiments of the invention even when the half-metal layer contains a certain quantity of metal magnetic regions of Co, Fe or Ni, for example. If pinhole regions in excess of 15% are observed by cross-sectional TEM, the resistance variable rate will degrade due to a current flowing in the pinhole regions. Embodiments of the invention make use of the mechanism of including magnetoresistance effect absolutely different from the mechanism relying on a current confinement effect for obtaining the resistance variable rate by means of a current of pinholes.

According to embodiments of the invention, since the half-metal magnetic film has a larger resistance than that of the metal magnetic film (although it is much more metallic than insulators), CPP elements of adequate resistance values can be realized. As a result, both the requirement of a large resistance variable rate and the requirement of an adequate device resistance can be satisfied, and a reproduction output property ensuring a large reproduction signal and low noise, and excellent in high-frequency property, can be obtained. Unlike the conventional spin-valve CPP elements having extremely thin oxide layers inserted therein, the spin-valve CPP elements using half-metals do not rely on the use of pinholes, and therefore can satisfy both the effect of magnetization pinning and realization of a large resistance variable rate. Thus the spin valve CPP elements according to embodiments of the invention can be readily controlled for mass production, and are suitable for practical use.

Regarding concrete dimensions and materials of respective components forming the magnetoresistive effect film, and shaped and materials of the electrodes, bias applying film, insulating film, etc., the invention encompasses any alternatives persons skilled in the art can make and bring into actual use by selecting adequate ones from known techniques, as far as the same effects can be obtained.

The components of the magnetoresistive effect element, such as antiferromagnetic layer, pinned layer, intermediate layer, free layer, etc., may be singular layers, or may be multi-layered films of two or more layers, respectively, When the magnetoresistive effect element according to any embodiment of the invention is applied to a reproducing magnetic head, if a write-use magnetic head is provided adjacent thereto, an integral recording/reproducing magnetic head can be obtained.

The magnetic reproducing apparatus according to any embodiment of the invention may be of a stationary type having a particular magnetic recording medium as a stationary part thereof, or may be of a removable type operative with a removable recording medium.

The magnetoresistive effect element according to any embodiment of the invention can be used to form a magnetic memory cell for magnetically storing information, either in combination with transistors, diodes, etc., or independently. That is, embodiments of the invention are applicable to a magnetic memory device (MRAM) integrating magnetic memory cells.

Furthermore, the invention encompasses all magnetoresistive effect elements, magnetic heads and magnetic storage/reproduction apparatuses that can be adequately modified and practically used by persons skilled in the art on the basis of magnetic heads and magnetic storage/reproduction apparatuses explained as embodiments of the invention.

As described above, according to embodiments of the invention, it is possible to simultaneously realize various properties that cannot be realized in conventional CPP magnetoresistive effect elements using TMR or metal-group spin-valve structures, such as large resistance variable amount, low noise, excellent response to high frequencies, and so on, by inserting one or more magnetic layers of a half-metal in the magnetoresistive effect film of the CPP magnetoresistive effect element having a pin-valve structure.

As a result, it is possible to provide a magnetic head excellent in response to high frequencies, ensuring a high output and having a high S/N ratio, as well as a magnetic reproducing apparatus incorporating the magnetic head.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistive effect element comprising:
   a magnetoresistive effect film including a magnetization-pinned layer having a magnetic film pinned in magnetization substantially in one direction, a magnetization free layer having a magnetic film variable in direction of magnetization in response to an external magnetic field, and a nonmagnetic metal intermediate layer interposed between said magnetization-pinned layer and said magnetization free layer; and
   a pair of electrodes electrically coupled to said magnetoresistive effect film to supply a current substantially perpendicularly to the film plane of said magnetoresistive effect film,
   at least one of said magnetization-pinned layer, said magnetization free layer and said nonmagnetic metal intermediate layer including a first layer which contains a half-metal as a major component thereof and a second layer whose content of said half-metal is lower than said first layer and higher than zero,
   wherein said half-metal is at least one of $CrO_2$ oxides and manganites.

2. A magnetoresistive effect element according to claim 1, wherein said half-metal is at least one of iron oxides having spontaneous magnetization, chromium oxides, and manganese oxides.

3. A magnetoresistive effect element according to claim 1, wherein said first layer is a continuous layer having an area ratio of pinholes not more than 15%.

4. A magnetoresistive effect element according to claim 1, wherein a thickness of said first layer is not less than 0.5 nm and not more than 5 nm.

5. A magnetoresistive effect element according to claim 1, wherein said magnetization free layer includes said first layer and said second layer whose magnetization direction varies in response to an external magnetic field more sensitively than said first layer.

6. A magnetoresistive effect element according to claim 5, wherein said second layer is provided between said first layer and said nonmagnetic metal intermediate layer.

7. A magnetoresistive effect element according to claim 5, wherein said first layer is provided between said second layer and said nonmagnetic metal intermediate layer.

8. A magnetoresistive effect element according to claim 1, wherein said magnetization free layer includes said first layer, said second layer and a third layer,
   a magnetization direction of said second layer varying in response to an external 6magnetic field more sensitively than said first layer, and a magnetization direction of said third layer varying in response to an external magnetic field more sensitively than said first layer,
   said first layer being provided between said second and third layers.

9. A magnetoresistive effect element according to claim 1, wherein said nonmagnetic metal intermediate layer includes said first layer, said second layer made of a nonmagnetic metal and a third layer made of a nonmagnetic metal,
   said first layer being provided between said second and third layers.

10. A magnetic head comprising a magnetoresistive effect element having:
    a magnetoresistive effect film including a magnetization-pinned layer having a magnetic film pinned in magnetization substantially in one direction, a magnetization free layer having a magnetic film variable in direction of magnetization in response to an external magnetic field, and a nonmagnetic metal intermediate layer interposed between said magnetization-pinned layer and said magnetization free layer; and
    a pair of electrodes electrically coupled to said magnetoresistive effect film to supply a current substantially perpendicularly to the film plane of said magnetoresistive effect film,
    at least one of said magnetization-pinned layer, said magnetization free layer and said nonmagnetic metal intermediate layer including a first layer which contains a half-metal as a major component thereof and a second layer whose content of said half-metal is lower than said first layer and higher than zero, wherein said half-metal is at least one of $CrO_2$ oxides and manganites.

11. A magnetic reproducing apparatus which reads information magnetically recorded in a magnetic recording medium, said magnetic reproducing apparatus comprising a magnetoresistive effect element having:

a magnetoresistive effect film including a magnetization-pinned layer having a magnetic film pinned in magnetization substantially in one direction, a magnetization free layer having a magnetic film variable in direction of magnetization in response to an external magnetic field, and a nonmagnetic metal intermediate layer interposed between said magnetization-pinned layer and said magnetization free layer; and a pair of electrodes electrically coupled to said magnetoresistive effect film to supply a current substantially perpendicularly to the film plane of said magnetoresistive effect film, at least one of said magnetization-pinned layer, said magnetization free layer and said nonmagnetic metal intermediate layer including a first layer which contains a half-metal as a major component thereof and a second layer whose content of said half-metal is lower than said first layer and higher than zero, wherein said half-metal is at least one of $CrO_2$ oxides and manganites.

* * * * *